US010938481B2

(12) United States Patent
Sugiyama

(10) Patent No.: US 10,938,481 B2
(45) Date of Patent: Mar. 2, 2021

(54) OPTICAL TRANSCEIVER, OPTICAL TRANSCEIVER MODULE USING THE SAME, AND TEST METHOD FOR OPTICAL TRANSCEIVER

(71) Applicant: Fujitsu Optical Components Limited, Kawasaki (JP)

(72) Inventor: Masaki Sugiyama, Kawasaki (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 0 days.

(21) Appl. No.: 16/587,822

(22) Filed: Sep. 30, 2019

(65) Prior Publication Data

US 2020/0136728 A1    Apr. 30, 2020

(30) Foreign Application Priority Data

Oct. 30, 2018   (JP) ................................ 2018-204258

(51) Int. Cl.
*H04B 10/40* (2013.01)
*G01R 31/3187* (2006.01)
(Continued)

(52) U.S. Cl.
CPC ......... *H04B 10/40* (2013.01); *G01R 31/3187* (2013.01); *G02B 6/122* (2013.01);
(Continued)

(58) Field of Classification Search
CPC ...... H04B 10/40; H04B 10/073; H04B 10/70; H04B 10/079; G01R 31/3187;
(Continued)

(56) References Cited

U.S. PATENT DOCUMENTS 5,319,482 A * 6/1994 Tsuchiya ............. H04B 10/071
                                                    356/73.1
6,771,857 B1 * 8/2004 Domash ............. G02B 6/12007
                                                    349/201
(Continued)

FOREIGN PATENT DOCUMENTS

JP       2016-24425      2/2016

OTHER PUBLICATIONS

Patent Abstracts of Japan English abstract for Japanese Patent Publication No. 2016-24425, published Feb. 8, 2016.

*Primary Examiner* — Abbas H Alagheband
(74) *Attorney, Agent, or Firm* — Staas & Halsey LLP

(57) ABSTRACT

An optical transceiver has a first optical waveguide connected to an input/output port for signal light, a second optical waveguide configured to input and output test light, an optical circuit configured to perform optical-to-electrical conversion or electrical-to-optical conversion, and an optical switch provided between the optical circuit and the first and the second optical waveguides and configured to switch between a first path connecting the optical circuit to the first optical waveguide and a second path connecting the optical circuit to the second optical waveguide, wherein the optical switch is configured to select the second path in an ON state with an electrical voltage being applied to the optical switch, and select the first path in an OFF state without the electrical voltage being applied to the optical switch.

13 Claims, 11 Drawing Sheets

(51) Int. Cl.
*G02B 6/42* (2006.01)
*G02F 1/225* (2006.01)
*G02B 6/122* (2006.01)
*G02F 1/21* (2006.01)

(52) U.S. Cl.
CPC ............ *G02B 6/4201* (2013.01); *G02F 1/225* (2013.01); *G02F 2001/212* (2013.01)

(58) Field of Classification Search
CPC ....... G02B 6/4201; G02B 6/122; G02F 1/225; G02F 2001/212; G02F 1/3136; G01M 11/30; H04Q 11/0005; H04Q 11/0062; H04Q 2011/0039; H04Q 2011/0083
USPC ........................................................ 398/135
See application file for complete search history.

(56) References Cited

U.S. PATENT DOCUMENTS

| | | | |
|---|---|---|---|
| 8,725,004 B1* | 5/2014 | Vawter | G02F 7/00 398/201 |
| 8,907,696 B2* | 12/2014 | Masuda | G01R 31/31917 324/762.01 |
| 10,623,108 B2* | 4/2020 | Streshinsky | G02B 6/4266 |
| 2004/0056243 A1* | 3/2004 | Atanackovic | G02B 6/1225 257/19 |
| 2007/0154137 A1* | 7/2007 | Mino | G02F 1/3136 385/16 |
| 2010/0097677 A1* | 4/2010 | Nazarathy | G02F 3/00 359/108 |
| 2016/0161333 A1 | 6/2016 | Stone et al. | |
| 2017/0093486 A1* | 3/2017 | Rad | H04B 10/0771 |
| 2017/0201813 A1* | 7/2017 | Sahni | H04B 10/801 |
| 2018/0045893 A1* | 2/2018 | Huybrechts | G02B 6/125 |
| 2019/0049666 A1* | 2/2019 | Welch | H04B 10/40 |
| 2019/0280776 A1* | 9/2019 | Makino | G02F 1/0121 |
| 2020/0132930 A1* | 4/2020 | Bchir | G02B 6/1225 |
| 2020/0162170 A1* | 5/2020 | Pang | H04B 10/691 |

* cited by examiner

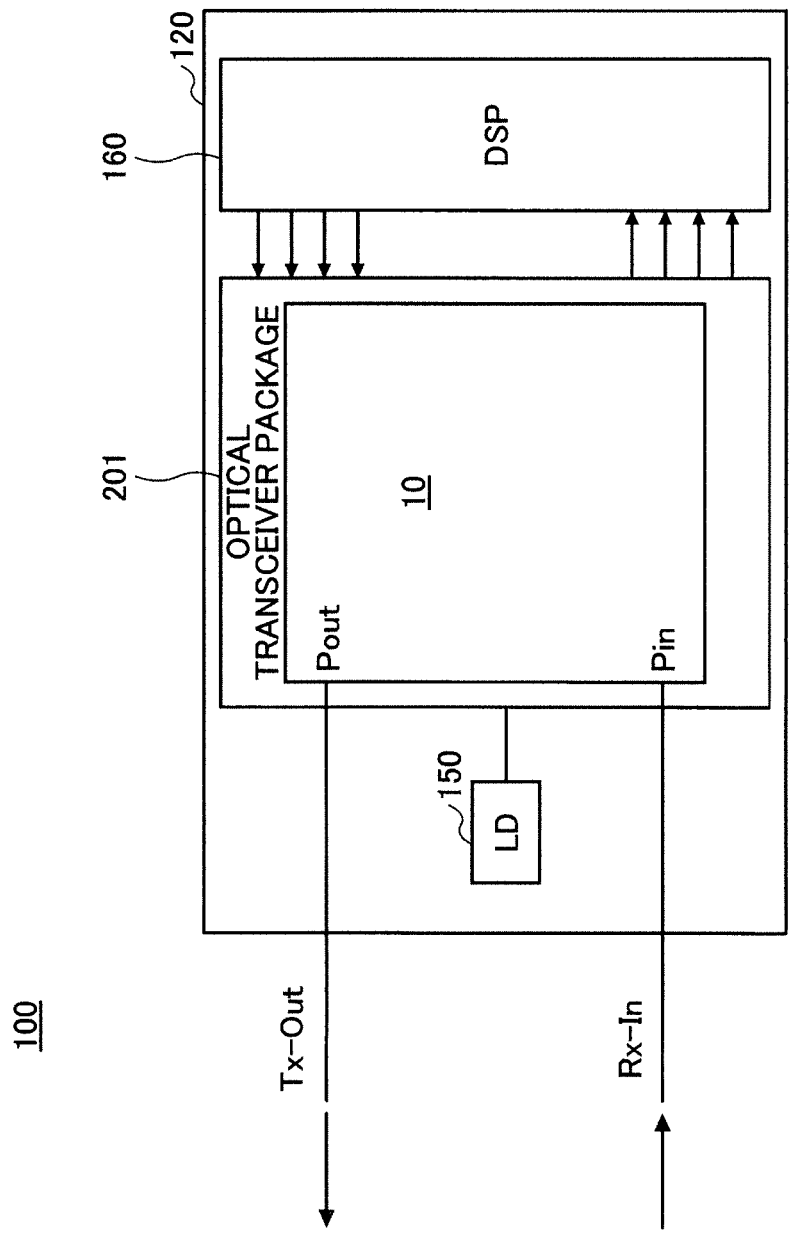

OPTICAL TRANSCEIVER, OPTICAL TRANSCEIVER MODULE USING THE SAME, AND TEST METHOD FOR OPTICAL TRANSCEIVER

CROSS-REFERENCE TO RELATED APPLICATIONS

This application is based upon and claims priority to earlier filed Japanese Patent Application No. 2018-204258 filed Oct. 30, 2018, which is incorporated herein by reference in its entirety.

FIELD

The present invention relates to an optical transceiver, an optical transceiver module using the same, and a test method for an optical transceiver.

BACKGROUND

Due to global spread of information and telecommunication devices such as smartphones and progress in the Internet of Things (IoT), demand for high-capacity optical transmission technology is increasing. A photonic integrated circuit (IC) is used as a frontend device for fiber optic communications to transmit and receive optical signals. Photonic IC is fabricated using a silicon photonics technology, and various optical elements for carrying out electrical-to-optical and optical-to-electrical conversion are integrated on a silicon chip.

The chip size of individual photonic ICs fabricated by silicon photonics technology is small, and they are generally mass-produced using a large-size wafer such as 300 mm diameter silicon wafer. Since it is inefficient to inspect individual photonic ICs in the chip state, wafer-level testing is performed for the respective photonic ICs fabricated on a wafer. For wafer-level testing, a grating coupler is provided in the chip area of each photonic IC. Test light is input to and output from the grating coupler in a direction perpendicular to the wafer using an optical fiber. The test light input to the grating coupler is optically coupled to the input waveguide of an optical circuit by means of a directional coupler or the like. The test light output from the optical circuit is optically coupled to the grating coupler by means of a directional coupler or the like.

A photonic system that performs wafer-level testing is known (see, for example, Patent Document 1 presented below). A grating coupler forming method for forming a grating coupler temporarily on a wafer at an arbitrary position has also been proposed (see, for example, Patent Document present below).

A directional coupler is designed generally to couple a part of light guided in a specific direction to another waveguide. When test light is introduced or extracted using a directional coupler, only a part of the test light is input to or output from the optical circuit, which may result in decreased measurement accuracy. Moreover, during the actual service, a part of the signal light is radiated by the directional coupler toward the vacant port provided for testing, and insertion loss will increase.

In a known photonic system, an optical path is switched between the light input/output port and the grating coupler by a 1-input 2-output (1×2) or 2-input 1-output (2×1) optical switch to select appropriate paths at the testing and during the actual service. Because, with this photonic system, control signals are provided to the optical switch for both the testing and the actual service, the control signals have to be regulated by constantly monitoring the electrical outputs and optical outputs of the photonic IC chip. For the monitoring, additional elements such as an optical switch control circuit, a tap for monitoring the optical output, a monitoring photodiode (PD), etc. are required, and the module size and the manufacturing cost increase. In addition, the output power of light is attenuated due to the increased number of taps.

A novel configuration and a method suitable for inspecting an optical transceiver, which can suppress degradation in measurement accuracy during wafer-level testing and reduce insertion loss during service, are desired.

PRIOR ART DOCUMENTS

Patent Document 1: US 2016/0161333 A1
Patent Document 2: Japanese Patent Application Laid-open Publication No. 2016-24425

SUMMARY

According to one aspect of the invention, an optical transceiver has
a first optical waveguide connected to an input/output port for signal light,
a second optical waveguide configured to input and output test light,
an optical circuit configured to perform optical-to-electrical conversion or electrical-to-optical conversion, and
an optical switch provided between the optical circuit and the first and the second optical waveguides and configured to switch between a first path connecting the optical circuit to the first optical waveguide and a second path connecting the optical circuit to the second optical waveguide,
wherein the optical switch is configured to select the second path in an ON state with an electrical voltage being applied to the optical switch, and select the first path in an OFF state without the electrical voltage being applied to the optical switch.

The object and advantages of the invention will be realized and attained by means of the elements and combinations particularly pointed out in the claims. It is to be understood that both the foregoing general description and the following detailed description are exemplary and explanatory and are not restrictive to the invention as claimed.

BRIEF DESCRIPTION OF DRAWINGS

FIG. 10 illustrates an optical transceiver module using an optical transceiver according to the embodiment.

DESCRIPTION OF EMBODIMENTS

In the embodiments, during inspection of individual optical transceivers on a wafer, optical loss of test light is suppressed to maintain the measurement accuracy, and during service of each of the diced optical transceiver chips, insertion loss is prevented from increasing. To achieve this, an optical switch adapted to switch between an optical path for inputting/outputting test light during inspection and an optical path for inputting/outputting signal light during service is well-configured.

Figure 1A:
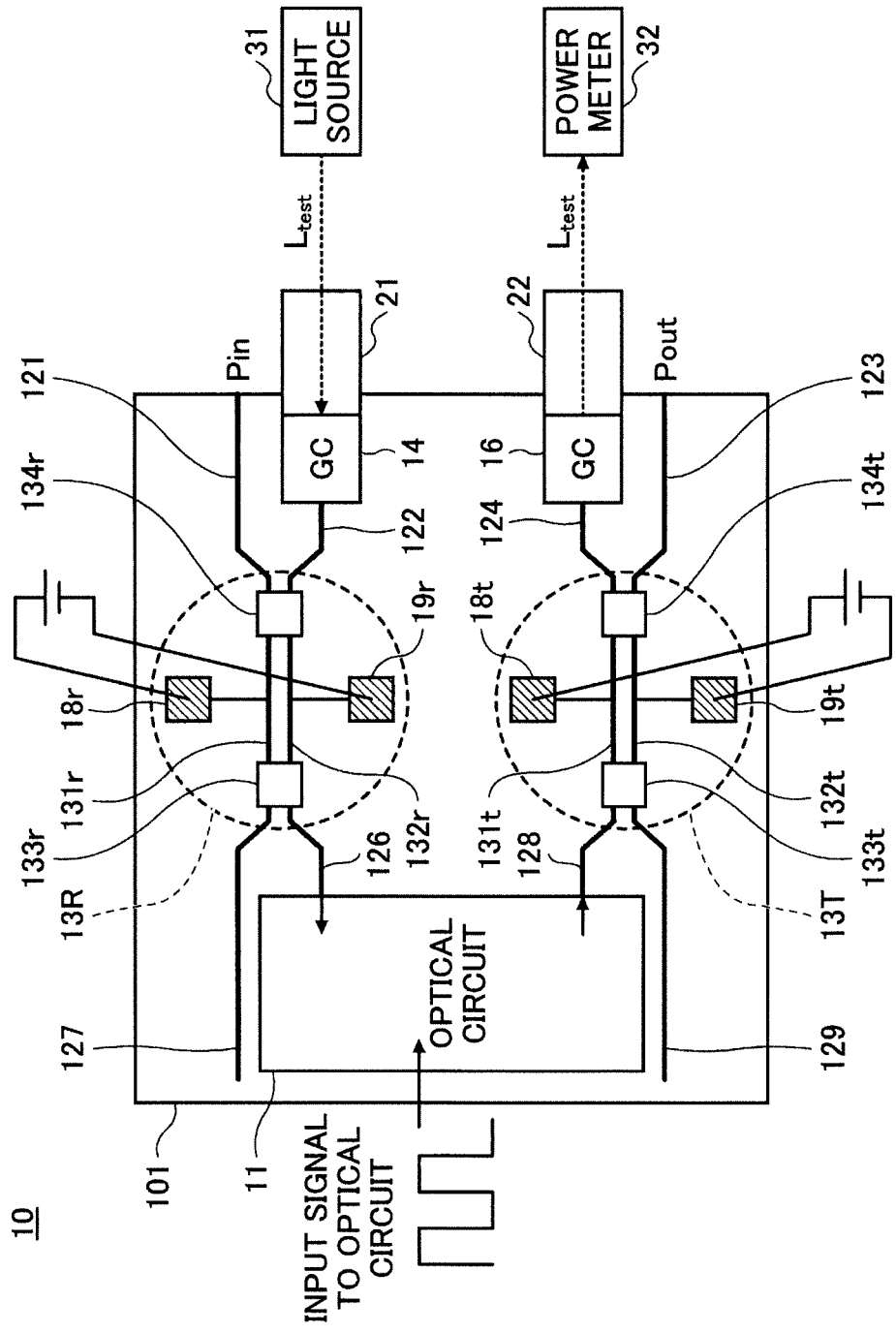
FIG. 1A illustrates a basic configuration of an optical transceiver during testing according to the embodiments.
Figure 1B:
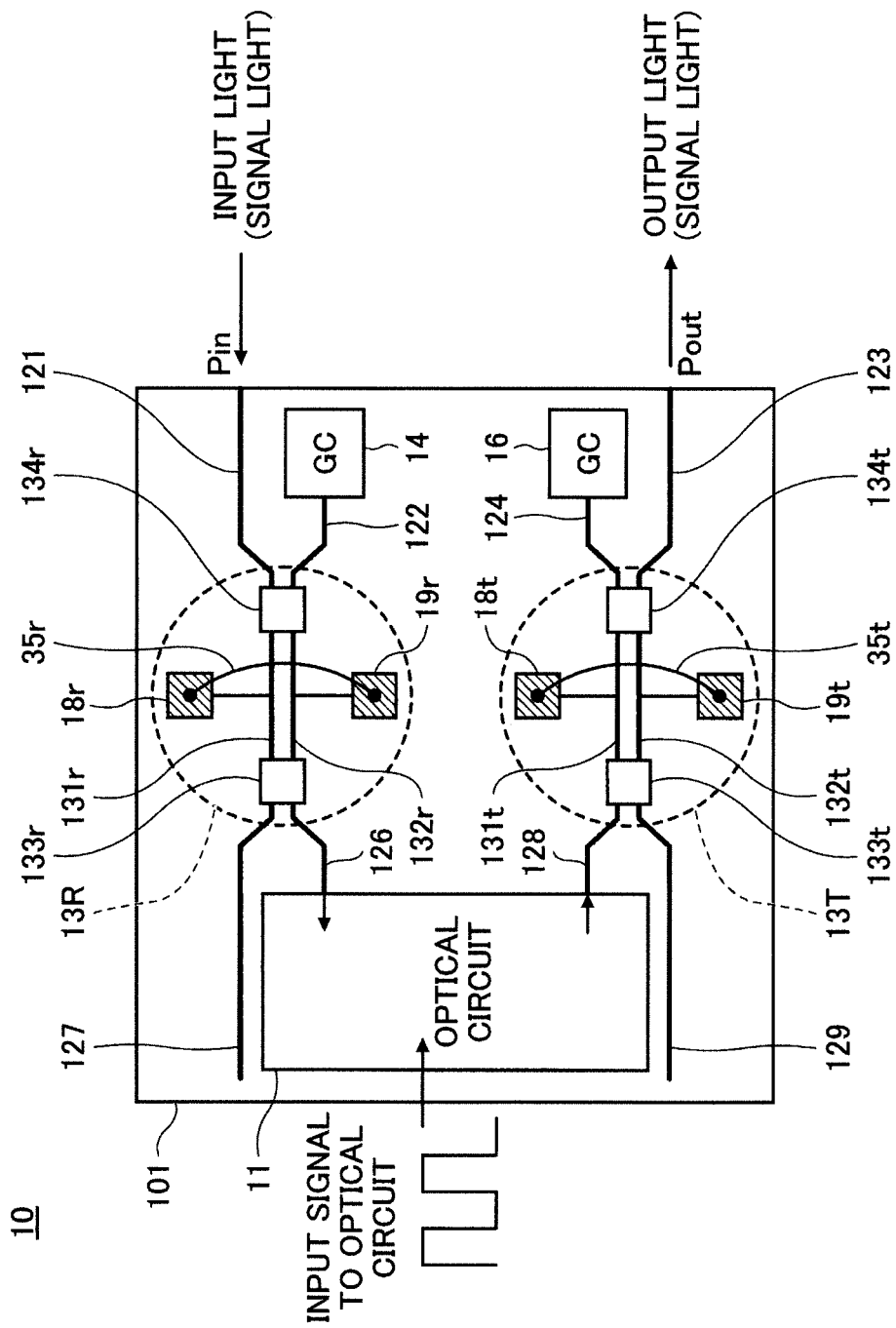
FIG. 1B illustrates a basic configuration of an optical transceiver during service according to the embodiments.

FIG. 1A illustrates an optical transceiver 10 according to an embodiment during wafer-level testing, and FIG. 1B illustrates the optical transceiver diced in a chip and operating during service.

The optical transceiver 10 has an optical circuit 11, an optical switch 13, and a plurality of optical waveguides on a substrate 101. Various optical elements such as an optical multiplexer/demultiplexer, an optical modulator, 90-degree hybrid optical mixer, etc. formed over the substrate 101 are integrated in the optical circuit 11 to implement optical-to-electrical conversion and electrical-to-optical conversion. The substrate 101 on which the optical circuit 11 is formed may be called a photonic IC.

The substrate 101 is provided with a light input port $P_{in}$ for inputting signal light, a light output port $P_{out}$ for outputting signal light, a grating coupler (hereinafter referred to as "GC") 14 serving as an input interface for introducing test light ($L_{test}$), and a GC 16 serving as an output interface for extracting test light ($L_{test}$). At the receiver side, a first input optical waveguide 121 extends from the light input port $P_{in}$, and a second input waveguide 122 extends from the GC 14. At the transmitter side, a first output waveguide 123 extends toward the light output port $P_{out}$, and a second output waveguide 124 extends toward the GC 16.

The configurations of the light input port $P_{in}$ and the light output port $P_{out}$ are not limited. These ports may be provided directly to the end of the first input optical waveguide 121 and the first output optical waveguide 123 exposed on the end surface of the substrate 101, or a spot size converter (SSC) connected to the first input waveguide 121 and the first output waveguide 123 may be provided for the light input/output ports.

The configurations of the test light input/output interfaces are not limited. Any suitable configuration, other than a GC, that can couple test light between an external optical fiber and the second input waveguide 122 and the second output waveguide 124 over the wafer may be employed. Such interfaces include, for example, a mirror and an obliquely extending waveguide.

An optical switch 13R is provided between the optical circuit 11 and an area in which the light input port $P_{in}$ and the GC 14 are provided. An optical switch 13T is provided between the optical circuit 11 and an area in which the light output port $P_{out}$ and the GC 16 are provided. Although in this example, the optical switch 13R and the optical switch 13T are of a Mach-Zehnder interferometer type, the configuration of an optical switch 13 is not limited to this example as will be described later.

The optical switch 13R is formed by two optical waveguides 131r and 132r extending between the optical couplers 133r and 134r. The first input of the optical switch 13R is connected to the first input waveguide 121 on the receiver side, and the second input of the optical switch 13R is connected to the second input waveguide 122 extending from the GC 14. The output of the optical switch 13R is connected to the optical circuit 11 by the optical waveguide 126. Another optical waveguide 127 extending from the optical coupler 133r is open-ended, without being connected anywhere.

The optical switch 13T is formed by two optical waveguides 131t and 132t extending between the optical couplers 133t and 134t. The first output of the optical switch 13T is connected to the first output waveguide 123 on the transmitter side, and the second output of the optical switch 13T is connected to the second output waveguide 124 extending to the GC 16. The input of the optical switch 13T is connected to the optical circuit 11 by the optical waveguide 128. Another optical waveguide 129 extending from the optical coupler 133t is open-ended, without being connected anywhere.

The optical switch 13R is provided with an electrode pad 18r and an electrode pad 19r, through which an electrical voltage can be applied to the optical switch 13R. One of the features of the embodiment is that under application of a voltage to the optical switch 13R (in the ON state), test light is input via the GC 14 to the optical circuit 11, and without application of voltage to the optical switch 13R (in the OFF state), received signal light is input via the light input port $P_{in}$ to the optical circuit 11.

Similarly, the optical switch 13T is provided with an electrode pad 18t and an electrode pad 19t, through which an electrical voltage can be applied to the optical switch 13T. Under application of a voltage to the optical switch 13T (in the ON state), test light output from the optical circuit 11 is supplied to the GC 16, and without application of voltage to the optical switch 13T (in the OFF state), signal light output from the optical circuit 11 so as to be transmitted is supplied to the light output port $P_{out}$.

FIG. 1A illustrates an on-wafer state before dicing, and the optical transceiver 10 is formed in a predetermined chip area over the wafer. When inspection is carried out over the wafer, a voltage is applied to the optical switch 13R and the optical switch 13T.

Test light emitted from the light source 31 is input to the GC 14 via an optical fiber 21. With a voltage applied to the optical switch 13R (the ON state), an optical path formed by the second input waveguide 122 extending from the GC 14 is connected to the optical circuit 11. The optical path for the test light connected by the optical switch 13R under the voltage ON state may be called a "second optical path" of the receiver side.

The test light is input to the optical circuit 11 and modulated by a high-frequency drive signal supplied from the outside to the optical circuit 11. The modulated test light is output from the optical circuit 11. Under application of a voltage to the optical switch 13T, the modulated test light is guided to the second output waveguide 124 on the transmitter side. The optical path for the test light connected by the optical switch 13T under the voltage ON state may be called a "second optical path" of the transmitter side. The modulated test light is output from the GC 16, propagates through the optical fiber 22, and is measured by the power meter 32.

In addition to inputting the continuous test light emitted from the light source 31 to the optical circuit 11, an optical data signal with a predetermined test pattern may be input from the GC 14 to the optical circuit 11. When inputting the test data signal, the optical switch 13R is turned on under application of a voltage. The signal receiving performance of the optical circuit 11 may be inspected by monitoring the electrical signal demodulated and output by the optical circuit 11.

FIG. 1B illustrates the optical transceiver 10 diced into an individual chip, which actually transmits and receives optical signals. The optical switch 13R and the optical switch 13T are in the OFF state without a voltage applied thereto. The optical path connected between the optical circuit 11 and the input optical waveguide 121 and the optical path connected between the optical circuit 11 and the input optical waveguide 123 under the voltage OFF state of the optical switches 13R and 13T may be called "first optical paths". The electrode pads 18r and 19r provided to the optical switch 13R are short-circuited by a bonding wire 35r. The electrode pads 18t and 19t provided to the optical switch 13T are short-circuited by a bonding wire 35t.

If the electrode pads 18r, 19r, 18t, and 19t are left open during service, a part of the high-frequency drive signal input to the optical circuit 11 may enter the electrode pads 18r and 19r of the optical switch 13R, or the electrode pads 18t and 19t of the optical switch 13T, causing crosstalk or noise. To avoid such a situation, the electrode pads 18r, 18t, 19r, and 19t are electrically short-circuited by wire bonding after the inspection is finished.

It is preferable for the electrode pads 18r and 19r of the optical switch 13R and the electrode pads 18t and 19t of the optical switch 13T to be formed large enough to allow wire bonding after the inspection. By increasing the size of the electrode pads 18r, 18t, 19r, and 19t, physical contact between the electrode pads and probe pins is also facilitated to apply a voltage to the optical switches 13R and 13T during the inspection.

In order to increase noise tolerance, the voltage applied to the optical switches 13R and 13T may be set greater than that of the electrical signals input to the optical circuit 11. With this configuration, when the crosstalk to the optical switch 13 due to the high-frequency drive signal input to the optical circuit 11 is, for example, −40 dB, the noise caused in the output light of the optical switch 13 can be suppressed to −40 dB or less.

Figure 2:
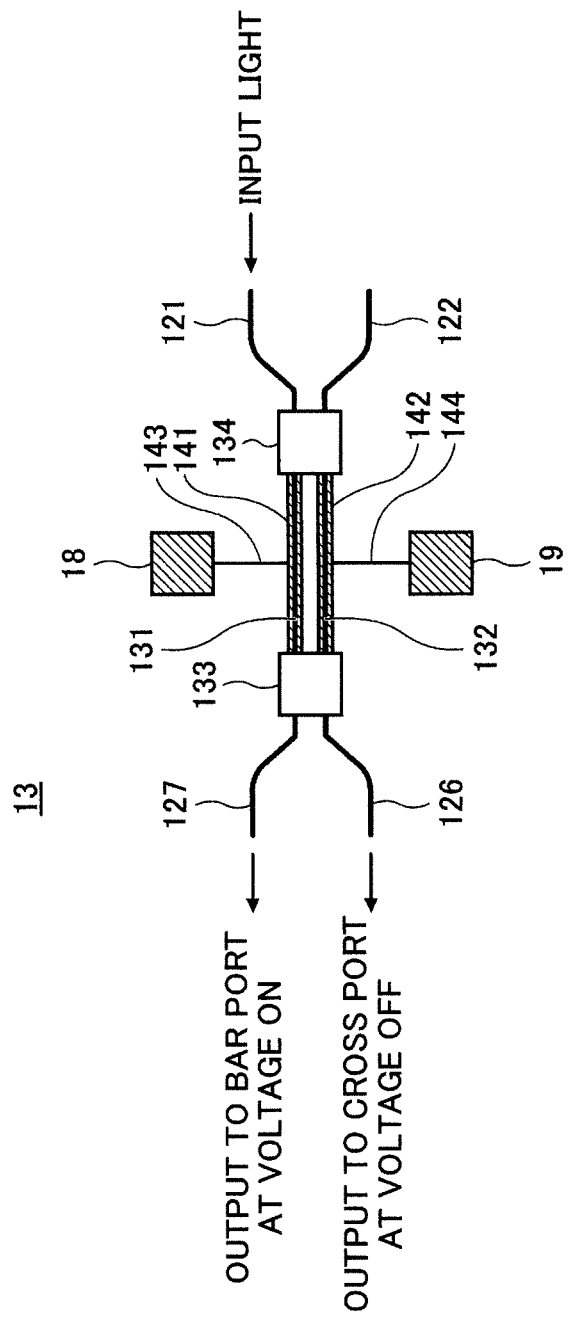
FIG. 2 illustrates a configuration example of an optical switch used in the embodiments.

FIG. 2 illustrates a configuration example of the optical switch 13 used in the optical transceiver 10. The optical switch 13 is of a Mach-Zehnder type formed by two optical waveguides 131 and 132 with the same length. The optical switch 13 formed by the optical waveguide 131 and the optical waveguide 132 is connected to two input waveguides and two output waveguides by, for example, two-input two-output (2×2) optical couplers 133 and 134, respectively.

An electrode 141 is provided to the optical waveguide 131, and an electrode 142 is provided to the optical waveguide 132. The electrode 141 is electrically connected to the electrode pad 18 by an interconnect line 143. The electrode 142 is electrically connected to the electrode pad 19 by an interconnect line 144.

With the same length, the same width, and the same refractive index of the two optical waveguides 131 and 132 of the Mach-Zehnder type optical switch 13, an output to a cross port can be obtained in the voltage OFF state, regardless of the wavelength. The light incident on the 2×2 optical coupler 134 from one of the two input waveguides is split into two light components with substantially the same intensity which travel through the optical waveguide 131 and the optical waveguide 132, respectively, of the optical switch 13. The light components having travelled through the optical waveguide 131 and the optical waveguide 132 are combined by the 2×2 optical coupler 133 and coupled to the cross port.

Upon application of a voltage onto the optical switch 13, the refractive index of at least one of the optical waveguides 131 and 132 changes depending on how the voltage is applied, and the difference in propagation constant between the optical waveguides 131 and 132 changes. The interference between the two light components varies, and the light combined at the optical coupler 133 is coupled to the bar port.

With this configuration, an output to the cross port is acquired without applying a voltage onto the optical switch 13 during service, while an output to the bar port is acquired under application of a voltage onto the optical switch 13 during inspection, and a high extinction ratio is achieved at the optical switch 13. Since during the inspection, most of the test light is incident on the optical circuit 11 from the bar port of the optical switch 13, the measurement accuracy can be maintained high. Since during service, most of the received signal light is incident on the optical circuit 11 from the cross port of the optical switch 13, insertion loss is suppressed.

<Modification 1>

Figure 3:
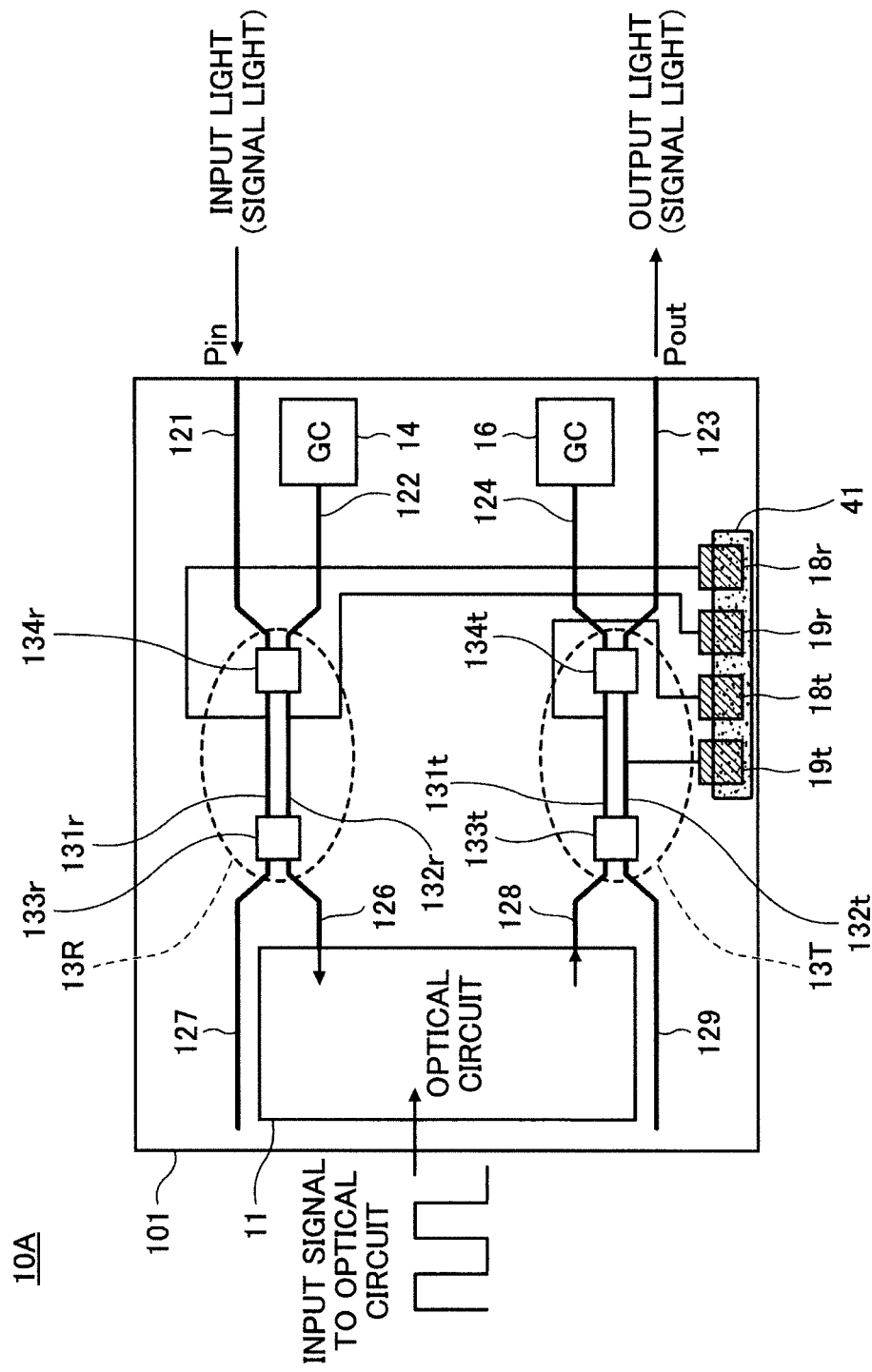
FIG. 3 illustrates a modification of the optical transceiver according to the embodiment.

FIG. 3 is a schematic diagram of an optical transceiver 10A which is a modification of the configuration of FIG. 1A and FIG. 1B. For convenience of illustration, the electrodes 141 and 142 provided to the optical waveguides 131 and 132, respectively, are omitted at the optical switches 13R and 13T. In the optical transceiver 10A, the electrode pads 18r and 19r used to apply a voltage to the optical switch 13R and the electrode pads 18t and 19t used to apply a voltage to the optical switch 13T are arranged adjacent to each other in an array, and these electrode pads are short-circuited by conductive adhesive 41 after the inspection or testing is finished.

During the inspection, the conductive adhesive 41 has not been applied yet. A voltage is applied via the electrode pads 18r and 19r to the optical switch 13R, and a voltage is applied via the electrode pads 18t and 19t to the optical switch 13T. Under application of the voltage, test light input from the GC 14 is guided to the optical circuit 11, and test light output from the optical circuit 11 is extracted from the GC 16.

Once a layer of conductive adhesive 41 is formed over the electrode pads, no voltage is applied to the optical switch 13R and the optical switch 13T and the voltage OFF state is maintained throughout the service. Signal light received from the optical path and input through the optical input port $P_{in}$ is supplied to the optical circuit 11, and signal light generated by the optical circuit 11 is output from the optical output port $P_{out}$. During the service, the high-frequency drive signal input to the optical circuit 11, which may cause crosstalk in optical signals, is prevented from entering the electrode pads 18r, 18t, 19r, and 19t, and the quality of the optical signal can be maintained with less deterioration.

The configuration of FIG. 3 does not need wire bonding for short-circuiting and the area size for arranging the electrode pads is reduced.

<Modification 2>

Figure 4:
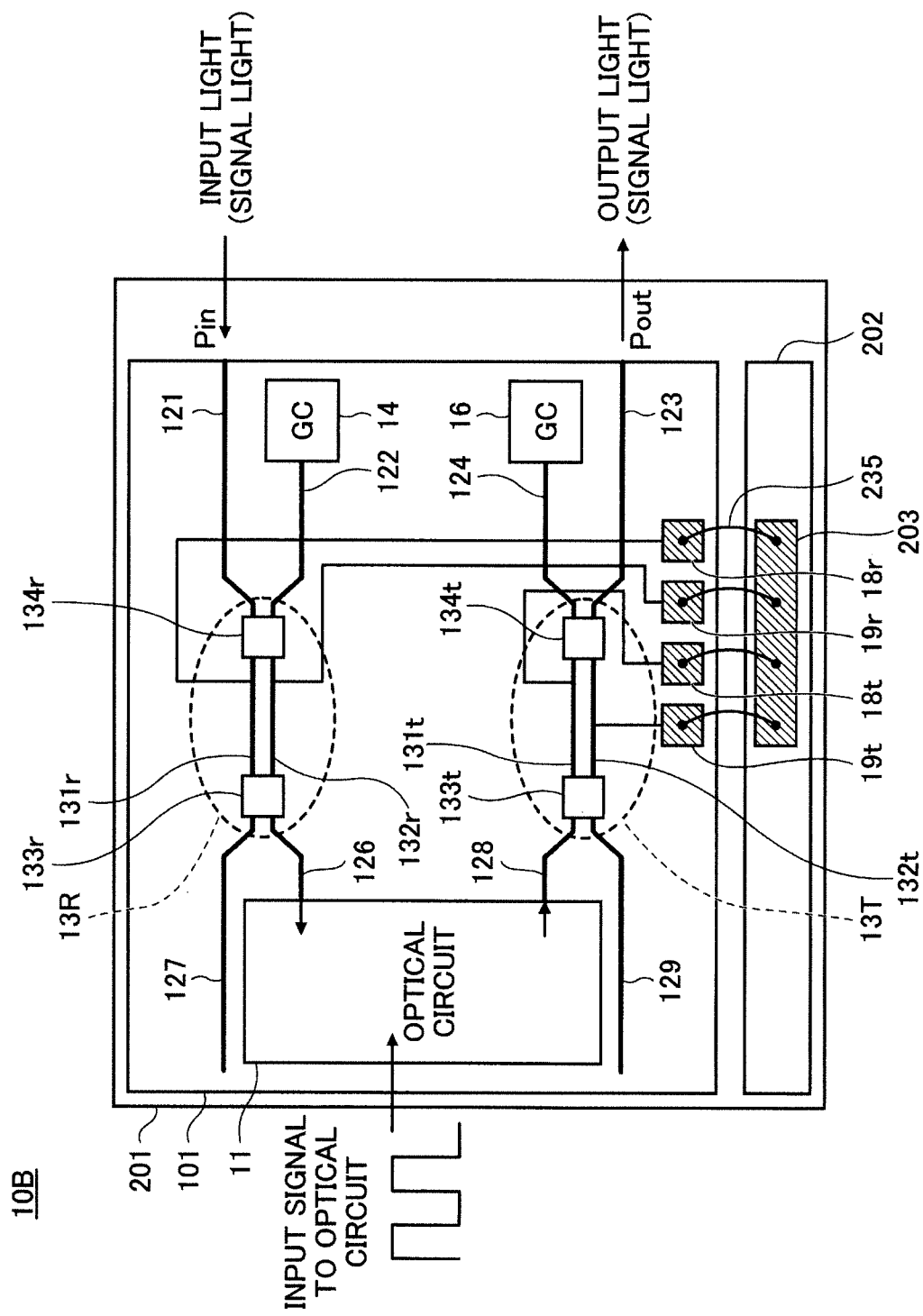
FIG. 4 illustrates another modification of the optical transceiver according to the embodiment.

FIG. 4 illustrates an optical transceiver 10B, which is another modification of the optical transceiver of the embodiment. In the optical transceiver 10B, the substrate 101 on which the optical circuit 11 is formed is placed in a package 201, together with the ground terminal 203. Each of the electrode pads 18r, 18t, 19r, and 19t provided over the substrate 101 in an array is connected to the ground terminal 203 by a bonding wire 235.

The ground terminal 203 is formed on a separate board 202 such as an interposer board, a package board, a carrier board, or the like. The operations of the optical switches 13R and 13T are the same as those described with reference to FIG. 1A and FIG. 1B. During service, no voltage is applied to the optical switches 13R and 13T of the optical transceiver 10B such that the optical input port $P_{in}$ and the optical output port $P_{out}$ are connected to the optical circuit 11, without using the GC 14 and GC 16. With the configuration of FIG. 4, the cross ports of the optical switches 13R and 13T are connected to the optical circuit 11 when no voltage is applied. Insertion loss is reduced during service, while the measurement accuracy is maintained during the inspection, owing to a high extinction ratio. By using the ground terminal 203, undesirable influence of noise to optical signals can be prevented in a more reliable manner.

<Modification 3>

Figure 5:
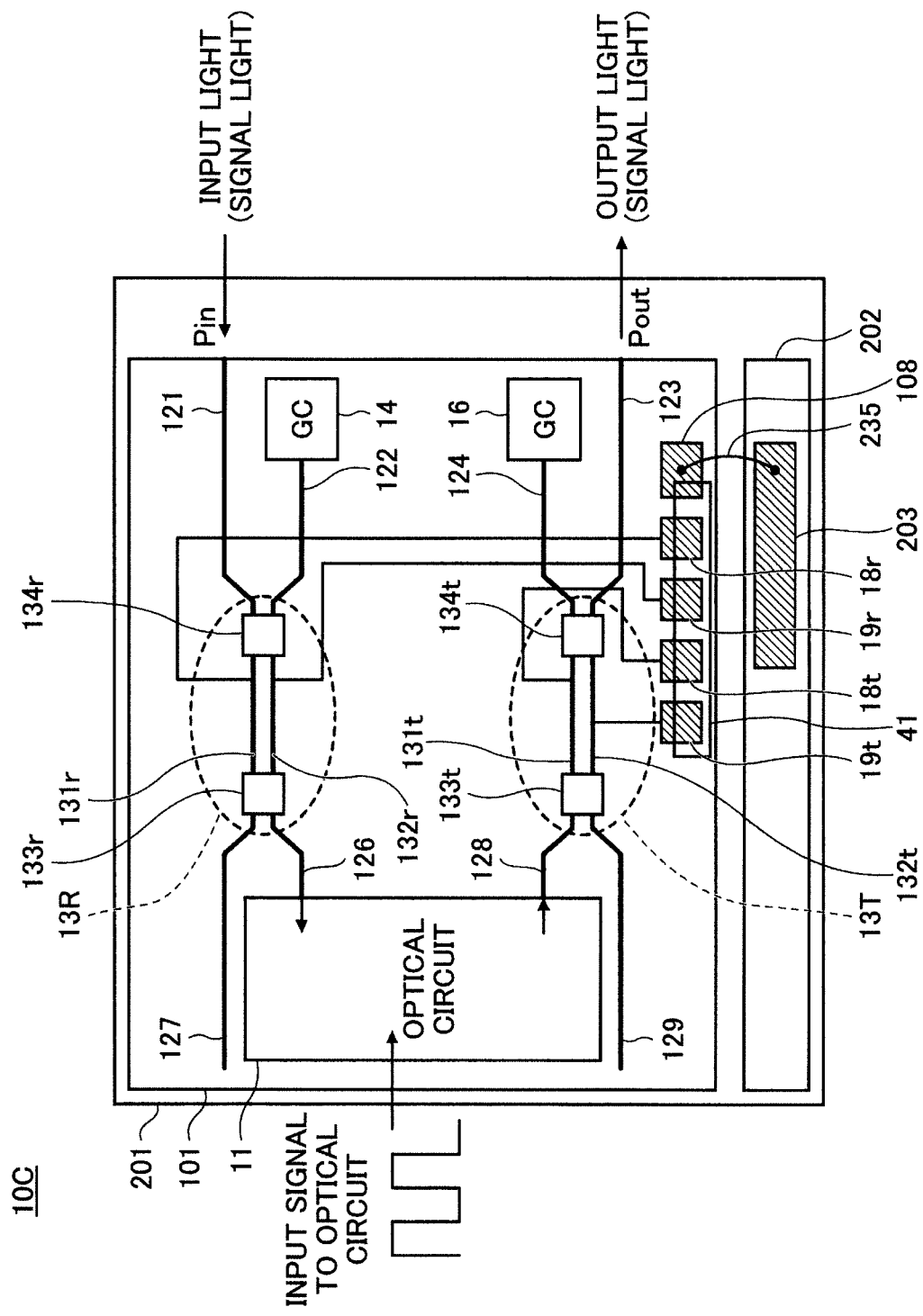
FIG. 5 illustrates still another modification of the optical transceiver according to the embodiment.

FIG. 5 illustrates an optical transceiver 10C which is still another modification of the optical transceiver of the embodiment. In the optical transceiver 10C, the electrode pads 18r and 19r of the optical switch 13R and the electrode pads 18t and 19t of the optical switch 13T are arranged close to each other in an array, together with a ground pad 108. The electrode pads 18r, 18t, 19r and 19t are electrically connected to the ground pad 108 via a conductive adhesive 41. The ground pad 108 is connected via a bonding wire 203 to a ground terminal 203 formed on a separate board 202.

The configuration of FIG. 5 is advantageous when a large number of electrode pads 18 and 19 are provided over the substrate 101. By connecting the electrode pads to the ground pad 108 via the conductive adhesive 41 and by connecting the ground pad 108 to the ground terminal 203, the number of bonding wires can be reduced. Besides, the electrode pads 18r and 19r of the optical switch 13R and the electrode pads 18t and 19t of the optical switch 13T can be short-circuited reliably.

<Test Method>

Figure 6:
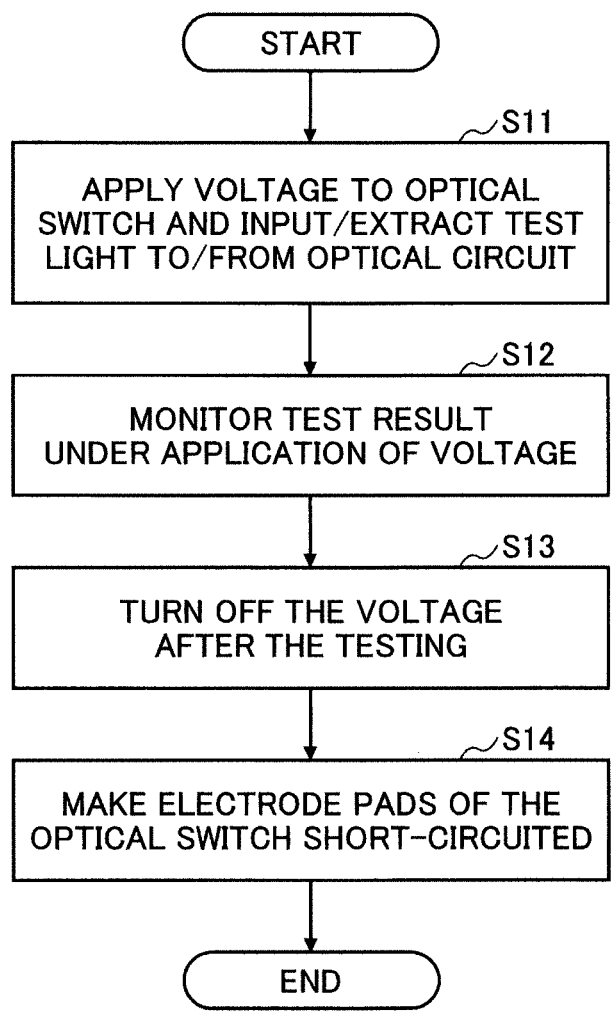
FIG. 6 is a flowchart of a test method for the optical transceiver according to the embodiment.

FIG. 6 is a flowchart of a test method for the optical transceiver 10. The test or the inspection is carried out over the wafer as illustrated in FIG. 1B. The optical transceiver 10 that has an optical circuit 11, optical switches 13, and optical waveguides 121, 122, 123 and 124 is fabricated in a predetermined area on the wafer.

In step S11, a voltage is applied to the optical switch 13. Test light is input via the GC 14 to the optical circuit 11, or test light output from the optical circuit 11 is extracted from the GC 16. The voltage applied to the optical switch 13 may be set greater than the drive voltage of the optical circuit 11.

The test result is monitored under the application of the voltage (S12). More specifically, the test light extracted from the GC 16 is measured by the power meter 32. Alternatively, the demodulated electrical signal output from the optical circuit 11 may be measured.

After the testing, the voltage having been applied to the optical switch 13 is turned off (S13). Because no voltage is applied to the optical switch 13 during the actual service of the optical transceiver 10, it is desirable to electrically short-circuit the electrode pads 18 and 19 provided to the optical switch 13 after the testing (S14).

With this method, loss of the test light is suppressed and the measurement accuracy can be maintained during the testing. In addition, during service, insertion loss is prevented from increasing and influence of noise to the optical signal can be prevented.

<Other Modifications>

Figure 7A:
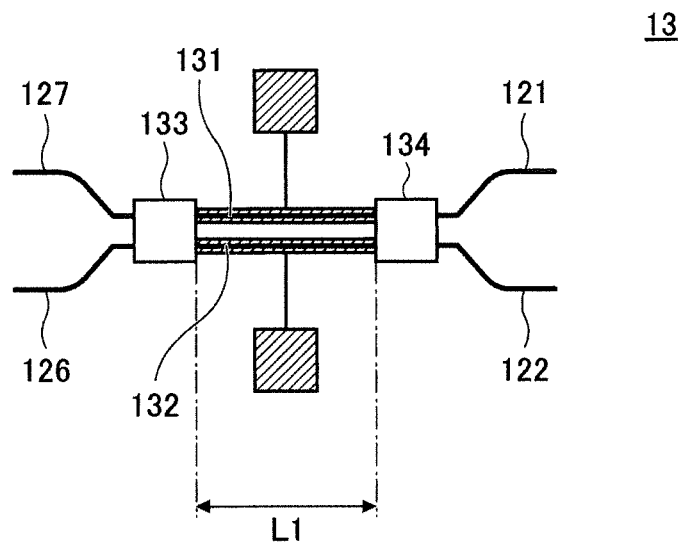
FIG. 7A illustrates an optical switch used for switching paths between wafer-level testing and actual service.
Figure 7B:
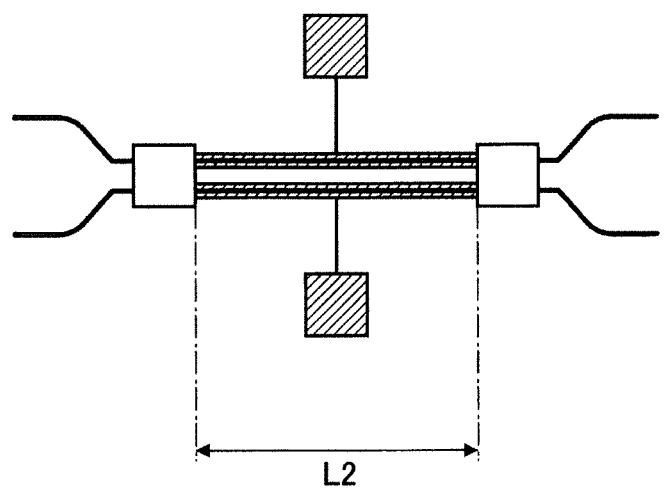
FIG. 7B illustrates an optical switch used in an optical circuit.

FIG. 7A and FIG. 7B illustrate a configuration example employed when the drive voltage for the optical switch 13 is set greater than that of the optical circuit 11. From the viewpoint of decreasing crosstalk at the optical switch 13 due to high-frequency electrical drive signals input to the optical circuit 11, it is desirable to set the drive voltage of the optical switch 13 so as to be greater than the drive voltage of the optical circuit 11. To achieve this, the electrode length L1 of the optical switch 13 of FIG. 7A may be set shorter than the electrode length L2 of the optical switch of FIG. 7B in the optical circuit 11. There are several switches provided in the optical circuit 11 to switch between, for example, optical modulators, optical paths or the like.

A drive voltage of an optical switch is inversely proportional to the length of the electrode. For example, by making the electrode length L1 of the optical switch 13 for switching the test path to the normal path half of the electrode length L2 of the optical switch in the optical circuit 11, the drive voltage of the optical switch 13 can be doubled.

Figure 8:
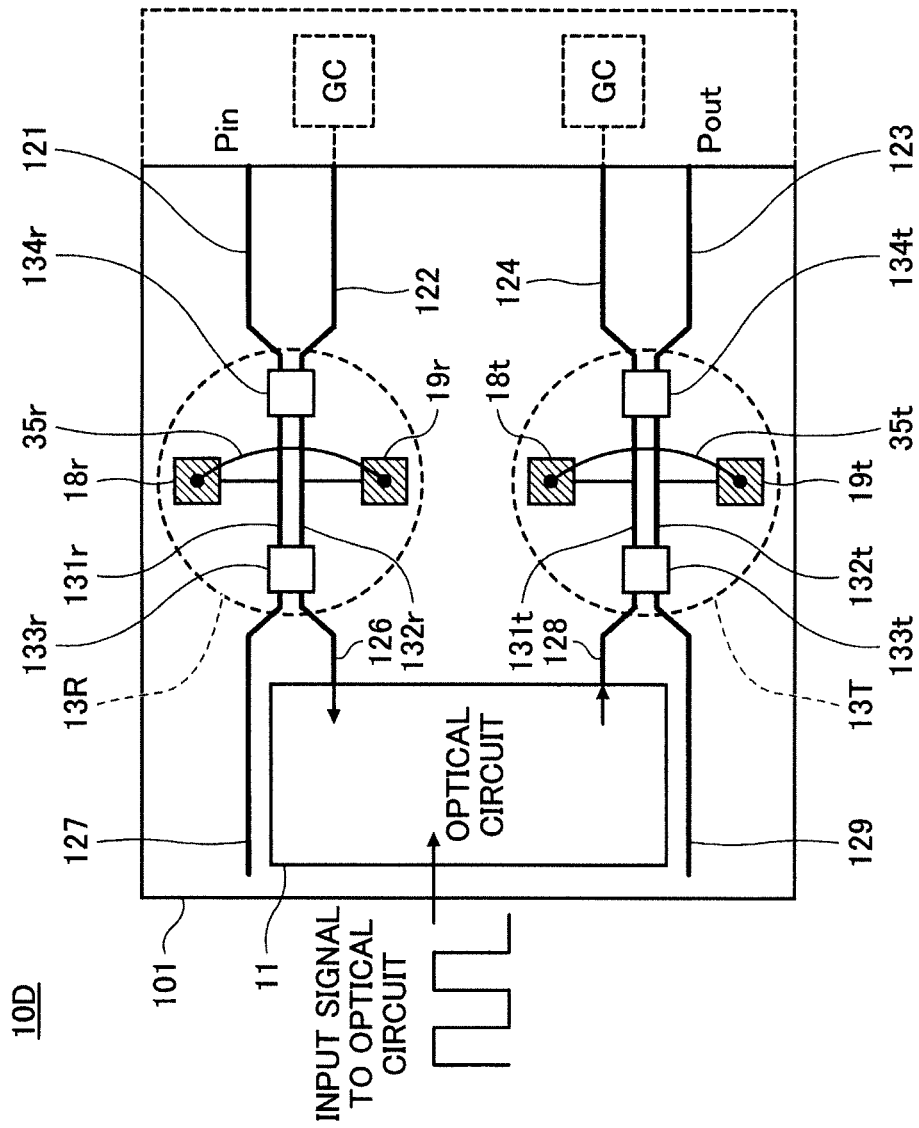
FIG. 8 illustrates yet another modification of the optical transceiver according to the embodiment.

FIG. 8 illustrates an optical transceiver 10D, which is still another modification of the optical transceiver of the embodiment. In the configurations illustrated in FIG. 3 to FIG. 5, the GC 14 and the GC 16 are left in the surface of the optical transceiver 10 even after the wafer is cut into chips. However, the GC 14 and the GC 16 may not necessarily be maintained in the optical transceiver 10 once an individual chip is acquired.

As illustrated in FIG. 8, a part of scribe lines that separate respective chip areas on a wafer may be expanded to produce an extra spacing indicated by the dashed line for providing GCs. In this configuration, during wafer-level testing, a voltage is applied to the optical switches 13R and 13T to turn them on, and the GCs formed in the extra spacing are used to input and extract test light through optical fibers.

Upon completion of the testing, the voltage having been applied to the optical switches 13R and 13T is turned off, and the wafer is cut into chips. At this point of time, the GCs formed in the extra spacing of the scribe line are cut off. In an individual chip after the die cutting, on the input side of the optical switch 13R, the optical waveguide 121 is connected to the optical input port $P_{in}$ and the optical waveguide 122 used for the testing is exposed at the end face of the chip.

Similarly, on the output side of the optical switch 13T, the optical waveguide 123 is connected to the optical output port $P_{out}$, and the optical waveguide 124 used for the testing is exposed at the end face of the chip.

The optical switches 13R and 13T are, for example, Mach-Zehnder type optical switches. Without voltage being applied to the switches 13 (in the OFF state), almost all of the received optical signal input through the optical waveguide 121 is coupled to the cross port of the optical switch 13R, and almost all of the optical signal to be transmitted is coupled to the cross port of the optical switch 13T and travels through the optical waveguide 123. There is little or negligible influence of reflection at the end faces of the optical waveguides 122 and 124 exposed at the chip end.

Figure 9A:
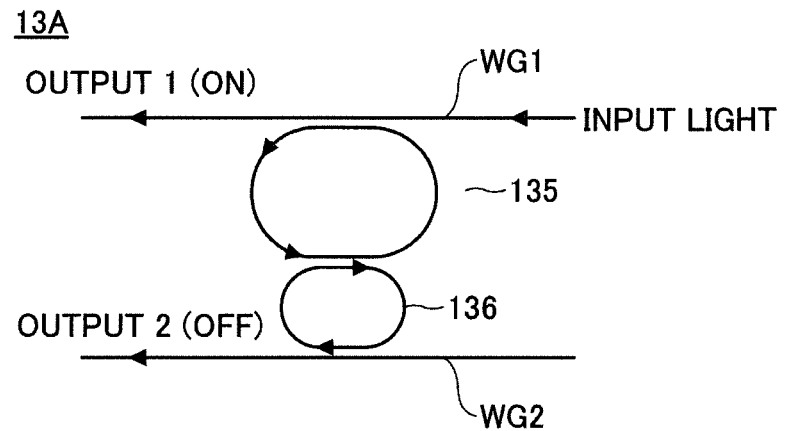
FIG. 9A illustrates a modification of the optical switch according to the embodiment.
Figure 9B:
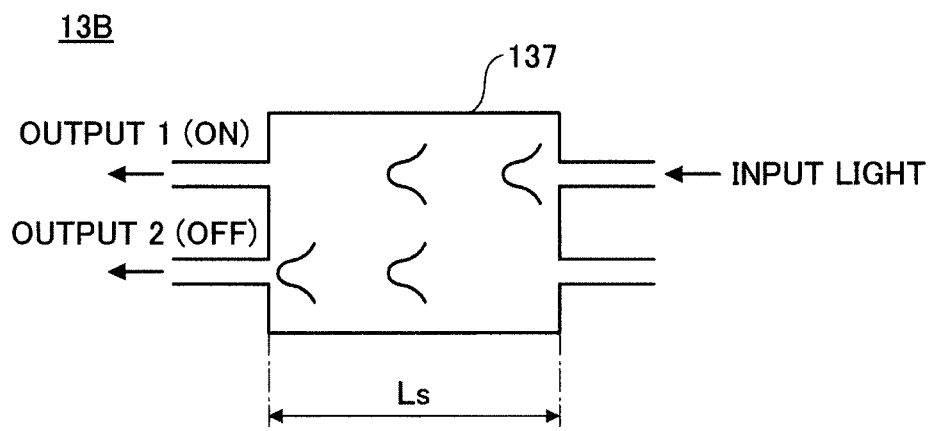
FIG. 9B illustrates another modification of the optical switch according to the embodiment.
Figure 9C:
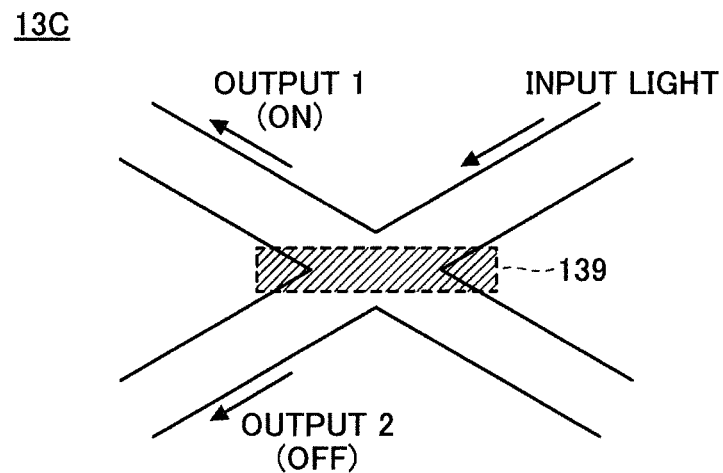
FIG. 9C illustrates still another modification of the optical switch according to the embodiment.

FIG. 9A to FIG. 9C illustrate modifications of the optical switch 13. The switch 13 may not necessarily be of a Mach-Zehnder type, and any suitable configuration may be employed.

FIG. 9A illustrates an optical switch 13A of a double ring type. A ring 135 and a ring 136 with different diameters are provided in series between the two optical waveguides WG1 and WG2. The circumference lengths of the ring 135 and the ring 136, the gap between the two rings 135 and 136, the coupling length and the gap between the optical waveguide WG1 and the ring 135, the coupling length and the gap between the ring 136 and the optical waveguide WG2, and other parameters are designed such that the almost the entirety of the light input to the optical waveguide WG1 is coupled to the optical waveguide WG2 without voltage application.

Almost the entirety of the light having travelled through the optical waveguide WG1 is coupled to the ring 135 and circulates around the ring. Upon the light traveling around the ring 135 meeting with the resonance condition of the ring 136 in a different mode, the light is coupled to the ring 136. When the light traveling around the ring 136 matches the resonance condition of the optical waveguide WG2, it is coupled to the optical waveguide WG2 and output (labelled as "output 2") in the direction same as the light input direction.

Upon application of a voltage to the optical switch 13A at the wafer-level testing, the refractive indexes of the ring 135 and the ring 136 change and the resonance conditions are changed. The light input to the WG1 goes straight (labeled as "output 1") without being coupled to the ring 135.

Again with this configuration, during the inspection, almost the entirety of the test light is input to the optical circuit 11, and almost the entirety of the test light output from the optical circuit 11 is extracted externally, whereby the measurement accuracy is maintained. In service, almost the entirety of a signal light is supplies from the optical input port $P_{in}$ to the optical circuit 11 and almost the entirety of a signal light generated by the optical circuit 11 is supplied to the optical output port $P_{out}$, whereby insertion loss is suppressed from increasing. The optical switch 13A can be used preferably when light of a single wavelength is used.

FIG. 9B illustrates an optical switch 13B of a multimode interference (MMI) type. The optical switch 13B is designed such that in the OFF state (no voltage applied), light incident from the input waveguide propagates through the slab waveguide 137, while being reflected in a number of excited modes, and that the phase difference among the modes becomes Π radians at the position Ls so as to be coupled to the output waveguide of "output 2" with an inverted wave profile.

Upon application of a voltage to the optical switch 13B during the wafer-level testing, the refractive index changes and the effective length Ls of the slab waveguide 137 changes by double, for example. As a result, the phase difference among the modes becomes 2Π radians, and the light is coupled to the output waveguide of "output 1" with a wave profile the same as that of the incident light.

Again with this configuration, during the inspection, almost the entirety of test light is supplied to the optical circuit 11, and almost the entirety of test light output from the optical circuit 11 is extracted externally, whereby the measurement accuracy is maintained. In service, almost the entirety of a signal light is supplied from the optical input port $P_{in}$ to the optical circuit 11, and almost the entirety of an optical signal generated by the optical circuit 11 is supplied to the optical output port $P_{out}$, whereby insertion loss is suppressed from increasing. The optical switch 13B is also used preferably when light of a single wavelength is used.

FIG. 9C illustrates an optical switch 13C of a total reflection type. In an OFF state without voltage application to the optical switch 13C, the input light passes straight through the intersection 139 and is coupled to the cross port labelled as "output 2". Upon application of a voltage to the intersection 139 of the optical switch 13C, the refractive index of the intersection 139 changes (decreases), and the incident light is totally reflected and coupled to the bar port labelled as "output 1".

Again with this configuration, during the inspection, almost the entirety of test light is supplied to the optical circuit 11, and almost the entirety of test light output from the optical circuit 11 is extracted externally, whereby the measurement accuracy is maintained. In service, almost the entirety of a signal light is supplied from the optical input port $P_{in}$ to the optical circuit 11, and almost the entirety of an optical signal generated by the optical circuit 11 is supplied to the optical output port $P_{out}$, whereby insertion loss is suppressed from increasing. The optical switch 13C is also used preferably when light of a single wavelength is used.

<Application of Optical Transceiver>

FIG. 10 is a schematic diagram of an optical transceiver module 100 to which the optical transceiver 10 of the embodiment is applied. The optical transceiver module 100 has the optical transceiver 10 designed as an optical transmitter/receiver frontend circuit chip, a light source (labelled as "LD") 150, and a digital signal processor (labelled as "DSP") 160, which are integrated in a package 120.

The optical transceiver 10 may be housed in a chip package 201 and the electrode pads of the optical switches 13 may be short-circuited to a ground terminal as illustrated in FIG. 3 to FIG. 5. In the chip package 201, an electronic circuit chip having a driver circuit configured to drive the optical circuit 11 and/or a transimpedance amplifier (TIA) circuit configured to convert a photocurrent output from the optical circuit 11 into an electrical voltage signal may be formed on an interposer board, together with the ground terminal.

The optical transceiver 10 assembled in the optical transceiver module 100 has already been inspected in the wafer state for ensuring the transmission/reception characteristics. Because of the optical switch 13 provided in the optical transceiver 10, optical loss is suppressed during the wafer-level testing and insertion loss is suppressed during service. A high quality low optical loss transceiver is achieved.

The above-described embodiments are just examples, and various modifications and substitutions are possible. For example, the number of GCs that serve as test light input/output interfaces is not limited to two, and a third GC for inputting a test data pattern may be provided. In this case, the test data pattern is input through the third GC to the optical circuit 11, and the test data pattern may be detected using the test light input as a local oscillated light beam from the GC 14.

In this case, a plurality of GCs including the third GC may be arranged in an array along an edge of the substrate 101. Such arrangement can facilitate the wafer-level testing and evaluation using a fiber optic array. Besides, by reducing the pitch of the GC array compared with the pitch of the optical input/output ports, a narrow pitch fiber optic array can be used and fiber alignment becomes easy.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority or inferiority of the invention. Although the embodiments of the present inventions have been described in detail, it should be understood that the various changes, substitutions, and alterations could be made hereto without departing from the spirit and scope of the invention.

What is claimed is:

1. An optical transceiver comprising:
   a first optical waveguide connected to an input/output port for signal light;
   a second optical waveguide configured to input and output test light;
   an optical circuit configured to perform optical-to-electrical conversion or electrical-to-optical conversion; and
   an optical switch provided between the optical circuit and the first and the second optical waveguides and configured to switch between a first path connecting the optical circuit to the first optical waveguide and a second path connecting the optical circuit to the second optical waveguide,
   wherein the optical switch is configured to select the second path in an ON state with an electrical voltage being applied to the optical switch, and select the first path in an OFF state without the electrical voltage being applied to the optical switch.

2. The optical transceiver as claimed in claim 1, wherein the optical switch is of a Mach-Zehnder type, a double ring type, a multimode interference type, or a total reflection type.

3. The optical transceiver as claimed in claim 1, wherein output of the optical switch is connected to a cross port in the OFF state, and connected to a bar port in the ON state.

4. The optical transceiver as claimed in claim 1, wherein the optical switch is provided with electrode pads that are electrically short-circuited.

5. The optical transceiver as claimed in claim 4, wherein each of the electrode pads is short-circuited by a bonding wire.

6. The optical transceiver as claimed in claim 4, wherein the electrode pads are arranged close to each other in an array and short-circuited collectively by a conductive adhesive.

7. The optical transceiver as claimed in claim 4, further comprising:
   a board on which a ground terminal is provided,
   wherein the electrode pads of the optical switch are connected to the ground terminal.

8. The optical transceiver as claimed in claim 4, further comprising:
   a ground pad positioned adjacent to the electrode pads of the optical switch; and
   a board on which a ground terminal is provided,
   wherein the electrodes pads and the ground pad are electrically connected to each other by a conductive adhesive, and the ground pad and the ground terminal are connected by a bonding wire.

9. The optical transceiver as claimed in claim 1, wherein an ON voltage of the optical switch is set higher than a drive voltage of the optical circuit.

10. The optical transceiver as claimed in claim 9, wherein an electrode length of the optical switch is shorter than an electrode length of a switch used in the optical circuit.

11. An optical transceiver module comprising:
    an optical transceiver having
       a first optical waveguide connected to an input/output port for signal light,
       a second optical waveguide configured to input and output test light,
       an optical circuit configured to perform optical-to-electrical conversion or electrical-to-optical conversion, and
       an optical switch provided between the optical circuit and the first and the second optical waveguides and configured to switch between a first path connecting the optical circuit to the first optical waveguide and a second path connecting the optical circuit to the second optical waveguide, the optical switch being configured to select the second path in an ON state with an electrical voltage being applied to the optical switch and select the first path in an OFF state without the electrical voltage being applied to the optical switch;
    a package configured to accommodate the optical transceiver;
    a light source provided in the package; and
    a digital signal processor provided in the package and connected to the optical transceiver.

12. A test method for an optical transceiver comprising:
    fabricating an optical transceiver having an optical circuit, a first optical waveguide connected to an input/output port for signal light, a second optical waveguide connected to an input/output interface for inputting and outputting test light, and an optical switch provided between the optical circuit and the first and the second optical waveguides, in a prescribed area on a wafer;
    inputting and extracting the test light using the input/output interface;
    applying a voltage to the optical switch to turn on the optical switch to connect the second optical waveguide to the optical circuit;
    measuring the test light input to the optical circuit; and
    turning off the voltage having been applied to the optical switch after measurement of the test light.

13. The test method as claimed in claim 12, further comprising:
    after the turning off the voltage, electrically short-circuiting electrode pads provided to the optical switch.

* * * * *